United States Patent
Kong et al.

(10) Patent No.: US 11,380,735 B2
(45) Date of Patent: Jul. 5, 2022

(54) DISPLAY PANEL HAVING BENDING DISPLAY REGION AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Chao Kong, Beijing (CN); Long Chen, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/905,552

(22) Filed: Jun. 18, 2020

(65) Prior Publication Data

US 2021/0193748 A1 Jun. 24, 2021

(30) Foreign Application Priority Data

Dec. 18, 2019 (CN) .......................... 201911308567.4

(51) Int. Cl.
*H01L 27/32* (2006.01)
*G09G 3/20* (2006.01)
(Continued)

(52) U.S. Cl.
CPC ...... *H01L 27/3213* (2013.01); *G06V 40/1318* (2022.01); *G09G 3/2003* (2013.01);
(Continued)

(58) Field of Classification Search
CPC .............. H04N 5/2257; H01L 27/3218; H01L 27/3213; G09G 3/2003; G09G 2320/0242;
(Continued)

(56) References Cited

U.S. PATENT DOCUMENTS

| 9,136,315 B1 | 9/2015 | Kim et al. |
| 2007/0064162 A1* | 3/2007 | Yamamoto ........... G09G 3/3406 348/790 |

(Continued)

FOREIGN PATENT DOCUMENTS

| CN | 102855821 A | 1/2013 |
| CN | 105280670 A | 1/2016 |

(Continued)

OTHER PUBLICATIONS

Chinese Patent Application No. 201911308567.4, First Office Action, dated Dec. 3, 2021.

*Primary Examiner* — Kwang-Su Yang
(74) *Attorney, Agent, or Firm* — Dinsmore & Shohl LLP

(57) ABSTRACT

The present disclosure relates to a display panel and a display device. The display panel comprises a substrate and pixel units arranged thereon. The substrate comprises a display area comprising a plane display area and a bending display area. The bending display area comprises first pixel areas arranged in an array, and the pixel units comprise first pixel units respectively positioned in the first pixel areas. The first pixel regions includes first pixel sub-regions including first display sub-pixels and at least one color difference adjusting sub-pixel for adjusting a color difference of the first pixel unit, and at least one second pixel sub-region. Each of the first pixel sub-regions is provided with the first display sub-pixels, each of the second pixel sub-regions is provided with the color difference adjusting (Continued)

sub-pixel, and the second pixel sub-region is disposed adjacent to the first pixel sub-regions.

17 Claims, 5 Drawing Sheets

(51) Int. Cl.
G06K 9/00 (2022.01)
H04N 5/225 (2006.01)
G06V 40/13 (2022.01)
(52) U.S. Cl.
CPC ....... *H01L 27/3218* (2013.01); *H04N 5/2257* (2013.01); *G09G 2300/0452* (2013.01); *G09G 2320/0242* (2013.01); *G09G 2320/045* (2013.01); *G09G 2320/0626* (2013.01); *G09G 2320/0666* (2013.01); *G09G 2380/02* (2013.01)
(58) Field of Classification Search
CPC ....... G09G 2380/02; G09G 2320/0626; G09G 2300/0452; G09G 2320/045; G09G 2320/0666; G09G 5/10; G06K 9/0004
See application file for complete search history.

(56) References Cited

U.S. PATENT DOCUMENTS

| 2008/0049048 A1* | 2/2008 | Credelle | G09G 3/2074 345/690 |
| 2013/0002133 A1 | 1/2013 | Jin et al. | |
| 2014/0247405 A1* | 9/2014 | Jin | G06F 1/1643 349/12 |
| 2019/0035862 A1 | 1/2019 | Koshihara | |
| 2019/0065717 A1* | 2/2019 | Won | G09G 5/003 |
| 2019/0164510 A1 | 5/2019 | Fang et al. | |
| 2019/0372057 A1 | 12/2019 | Park et al. | |
| 2020/0192013 A1* | 6/2020 | Oh | G02B 6/0011 |
| 2021/0012080 A1 | 1/2021 | Fan | |
| 2021/0109638 A1* | 4/2021 | Hsieh | G06K 9/0004 |
| 2021/0183959 A1* | 6/2021 | Hong | H01L 27/3211 |

FOREIGN PATENT DOCUMENTS

| CN | 107942565 A | 4/2018 |
| CN | 108596124 A | 9/2018 |
| CN | 109887984 A | 6/2019 |
| CN | 110544749 A | 12/2019 |

* cited by examiner

DISPLAY PANEL HAVING BENDING DISPLAY REGION AND DISPLAY DEVICE

CROSS-REFERENCE TO RELATED APPLICATIONS

The present application claims the priority to the Chinese patent application No. 201911308567.4 filed on Dec. 18, 2019, which is hereby fully incorporated herein by reference in its entirety.

TECHNICAL FIELD

The present disclosure relates to display technologies, and in particular, to a display panel and a display device.

BACKGROUND

With the development of consumer electronics products such as mobile phones, products using Organic Light-Emitting diodes (OLEDs) for bending screens are increasing in proportion in the display consumer market, and the requirements for the bending angle of the bending screen are also increasing. In addition, the technology of fingerprint identification under the screen and the technology of a camera under the screen are also important development directions of the OLED display screen.

SUMMARY

One aspect of the present disclosure provides a display panel comprising a substrate and a plurality of pixel units arranged on the substrate, wherein the substrate comprises a display area, the display area comprises a plane display area and a bending display area, the bending display area is adjacent to the plane display area, and at least part of normal lines of the bending display area is not parallel to a normal line of the plane display area; the bending display area comprises a plurality of first pixel areas arranged in an array, and the plurality of pixel units comprise a plurality of first pixel units which are respectively positioned in the plurality of first pixel areas; each of the plurality of first pixel regions includes a plurality of first pixel sub-regions and at least one second pixel sub-region, each of the plurality of first pixel units includes a plurality of first display sub-pixels and at least one color difference adjusting sub-pixel for adjusting a color difference of the first pixel unit, each of the first pixel sub-regions is provided with at least one of the plurality of first display sub-pixels, each of the second pixel sub-regions is provided with the at least one color difference adjusting sub-pixel, and the at least one second pixel sub-region is disposed adjacent to at least one of the plurality of first pixel sub-regions.

In some embodiments, a color of the at least one color difference adjusting sub-pixel is the same as a color of at least one of the plurality of first display sub-pixels, and a brightness of the at least one color difference adjusting sub-pixel is adjustable.

In some embodiments, centers of the plurality of first pixel sub-regions and the second pixel sub-region are located on the same straight line.

In some embodiments, the first pixel unit includes three first display sub-pixels and one color difference adjustment sub-pixel, the first pixel region includes three first pixel sub-regions and one second pixel sub-region, the three first display sub-pixels are respectively located in the three first pixel sub-regions, and the color difference adjustment sub-pixel is located in the second pixel sub-region.

In some embodiments, the three first display sub-pixels are a red sub-pixel, a green sub-pixel, and a blue sub-pixel, respectively, and the color difference adjustment sub-pixel has the same color as one of the red sub-pixel, the green sub-pixel, and the blue sub-pixel.

In some embodiments, the first pixel unit includes four first display sub-pixels and one color difference adjustment sub-pixel, the first pixel region includes three first pixel sub-regions and one second pixel sub-region, two of the four first display sub-pixels are located in one of the three first pixel sub-regions and two other of the four first display sub-pixels are located in two other of the first pixel sub-regions of the three first pixel sub-regions, respectively, and the color difference adjustment sub-pixel is located in the second pixel sub-region.

In some embodiments, the four first display sub-pixels are a red sub-pixel, a first green sub-pixel, a second green sub-pixel, and a blue sub-pixel, the first green sub-pixel and the second green sub-pixel are located in the same first pixel sub-region, and the color difference adjustment sub-pixel has the same color as one of the red sub-pixel, the first green sub-pixel, the second green sub-pixel, and the blue sub-pixel.

In some embodiments, the first pixel region includes three first pixel sub-regions and one second pixel sub-region, virtual lines connecting centers of the three first pixel sub-regions form a first shape of a right triangle, and the second pixel sub-region is located on a side of a hypotenuse of the first shape away from a right-angled point.

In some embodiments, the first pixel unit includes three first display sub-pixels and one color difference adjustment sub-pixel, the three first display sub-pixels are respectively located in the three first pixel sub-regions, the color difference adjustment sub-pixel is located in the second pixel sub-region, the three first display sub-pixels are respectively a red sub-pixel, a green sub-pixel, and a blue sub-pixel, the color difference adjustment sub-pixel has the same color as one of the red sub-pixel, the green sub-pixel, and the blue sub-pixel, and virtual lines connecting centers of the second pixel sub-region and corner points at both ends of the hypotenuse of the first shape form a second shape of a right triangle.

In some embodiments, the display area further comprises: a fingerprint identification area positioned in the plane display area; the fingerprint identification area comprises a plurality of second pixel areas arranged in an array, and the pixel units further comprise a plurality of second pixel units respectively positioned in the second pixel areas; each of the plurality of second pixel regions includes a plurality of third pixel sub-regions and at least one fourth pixel sub-region, each of the plurality of second pixel units includes a plurality of second display sub-pixels and at least one fingerprint light source sub-pixel for providing a light source to the fingerprint sensor upon fingerprint recognition, each of the third pixel sub-regions is provided with at least one of the plurality of second display sub-pixels, each of the fourth pixel sub-regions is provided with the at least one fingerprint light source sub-pixel, and the at least one fourth pixel sub-region is disposed adjacent to at least one of the plurality of third pixel sub-regions.

In some embodiments, a color of the at least one fingerprint light source sub-pixel is the same as a color of at least one of the plurality of second display sub-pixels.

In some embodiments, centers of the plurality of third pixel sub-regions and the fourth pixel sub-region are located on the same line.

In some embodiments, the second pixel unit comprises three second display sub-pixels and one fingerprint light source sub-pixel, the second pixel region comprises three third pixel sub-regions and one fourth pixel sub-region, the three second display sub-pixels are respectively located in the three third pixel sub-regions, and the fingerprint light source sub-pixel is located in the fourth pixel sub-region.

In some embodiments, the three second display sub-pixels are a red sub-pixel, a green sub-pixel, and a blue sub-pixel, respectively, and the fingerprint light source sub-pixel has the same color as the green sub-pixel.

In some embodiments, the second pixel unit comprises four second display sub-pixels and one fingerprint light source sub-pixel, the second pixel region comprises three third pixel sub-regions and one fourth pixel sub-region, two of the four second display sub-pixels are located in the same one of the three third pixel sub-regions, and two other of the four second display sub-pixels are located in two other of the third pixel sub-regions of the three third pixel sub-regions, respectively, and the fingerprint light source sub-pixel is located in the fourth pixel sub-region.

In some embodiments, the four second display sub-pixels are a red sub-pixel, a first green sub-pixel, a second green sub-pixel, and a blue sub-pixel, the first green sub-pixel and the second green sub-pixel are located in the same third pixel sub-region, and the fingerprint light source sub-pixel has the same color as any one of the first green sub-pixel and the second green sub-pixel.

In some embodiments, the second pixel region includes three third pixel sub-regions and one fourth pixel sub-region, virtual lines connecting centers of the three third pixel sub-regions form a third shape of a right triangle, and the fourth pixel sub-region is located on a side of a hypotenuse of the third shape away from a right angle point.

In some embodiments, the second pixel unit includes three second display sub-pixels and one fingerprint light source sub-pixel, the three second display sub-pixels are respectively located in the three third pixel sub-regions, the fingerprint light source sub-pixel is located in the fourth pixel sub-region, the three second display sub-pixels are respectively a red sub-pixel, a green sub-pixel and a blue sub-pixel, the fingerprint light source sub-pixel has the same color as the green sub-pixels, and the virtual lines connecting a center of the fourth pixel sub-region and corner points at two ends of a hypotenuse of the third shape form a fourth shape of a right triangle.

In some embodiments, the display area further comprises: the front camera shooting area positioned in the plane display area; the front camera shooting area comprises a plurality of third pixel areas which are arranged in an array, and the pixel units also comprise a plurality of third pixel units which are respectively positioned in the third pixel areas; each of the plurality of third pixel regions includes a plurality of fifth pixel sub-regions and at least one sixth pixel sub-region, each of the plurality of third pixel units includes a plurality of third display sub-pixels and at least one transparent display sub-pixel, each of the fifth pixel sub-regions is provided with at least one of the plurality of third display sub-pixels, each of the sixth pixel sub-regions is provided with the at least one transparent display sub-pixel, and the at least one sixth pixel sub-region is disposed adjacent to at least one of the plurality of fifth pixel sub-regions.

In some embodiments, the transparent display sub-pixel comprises: the buffer layer is positioned in the sixth pixel sub-region; the planarization layer is positioned on one side of the buffer layer, which is far away from the substrate base plate; the organic light-emitting layer is positioned on one side, far away from the buffer layer, of the planarization layer; the transparent metal layer is positioned on one side of the organic light-emitting layer, which is far away from the planarization layer; and the thin film packaging layer is positioned on one side of the transparent metal layer, which is far away from the organic light-emitting layer.

In some embodiments, the transparent display sub-pixel further comprises: and the optical coupling layer is positioned between the film packaging layer and the transparent metal layer.

In some embodiments, a display device is provided, and comprises a display panel as described above.

BRIEF DESCRIPTION OF THE DRAWINGS

The accompanying drawings, which are incorporated in and constitute a part of this specification, illustrate embodiments of the disclosure and together with the description, serve to explain the principles of the disclosure.

The present disclosure can be more clearly understood from the following detailed description taken in conjunction with the accompanying drawings, in which.

It should be understood that the dimensions of the various parts shown in the drawings are not drawn to scale. Further, the same or similar reference numerals denote the same or similar components.

DETAILED DESCRIPTION

Figure 1:
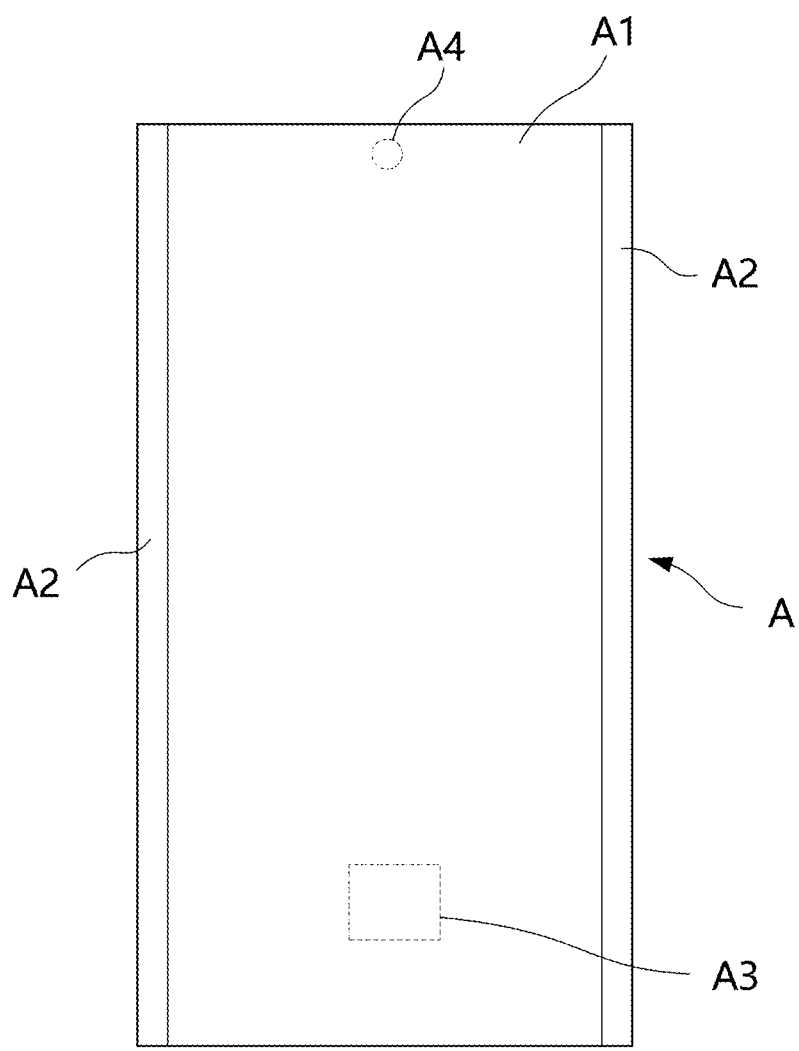
FIGS. 1 and 2 are schematic structural diagrams of a substrate in a front view and a bottom view, respectively, according to an embodiment of a display panel of the present disclosure.

Various exemplary embodiments of the present disclosure will now be described in detail with reference to the accompanying drawings. The description of the exemplary embodiments is merely illustrative and is in no way intended to limit the disclosure, its application, or usages. The present disclosure may be embodied in many different forms and is not limited to the embodiments described herein. These embodiments are provided so that this disclosure will be thorough and complete, and will fully convey the scope of the disclosure to those skilled in the art. It should be noted that the relative arrangement of parts and steps, the composition of materials, numerical expressions and numerical values set forth in these embodiments are to be construed as merely illustrative, and not restrictive, unless specifically stated otherwise.

The use of "first", "second", and similar words in this disclosure is not intended to indicate any order, quantity, or importance, but rather is used to distinguish one element from another. The word "comprising" or "comprises", and the like, means that the element preceding the word comprises the element listed after the word, and does not exclude the possibility that other elements may also be included. The word "upper", "lower", "left", "right", and the like are used only to indicate relative positional relationships, and when the absolute position of the object being described is changed, the relative positional relationships may also be changed accordingly.

In the present disclosure, when a particular device is described as being located between a first device and a second device, intervening devices may or may not be present between the particular device and the first device or the second device. When a particular device is described as being coupled to another device, it can be directly coupled to the other device without intervening devices or can be directly coupled to the other device with intervening devices.

All terms (including technical or scientific terms) used herein have the same meaning as commonly understood by one of ordinary skill in the art to which this disclosure belongs unless specifically defined otherwise. It will be further understood that terms, such as those defined in commonly used dictionaries, should be interpreted as having a meaning that is consistent with those in the context of the relevant art and will not be interpreted in an idealized or overly formal sense unless expressly so defined herein.

Techniques, methods, and apparatus known to one of ordinary skill in the relevant art may not be discussed in detail but are intended to be part of the specification where appropriate. Research shows that when the bending angle of an OLED bending screen adopting a top-emission microcavity structure in the related art is large (for example, the bending angle is 90 degrees, even 110 degrees or more), a large-angle bending area has a problem that the color deviation varies with the angle, for example, the bending display area has a color deviation phenomenon such as turning yellow, green or blue, and the like, and the visual effect is affected.

In some related art, a pixel region in a fingerprint recognition region of a display screen is used for image display, and also emits a high-brightness green light at the time of fingerprint recognition, so that the sensor senses a fingerprint by using a reflected light from a finger. According to research, after the self-luminous OLED display panel is used for a long time, the service life of the green pixels in the pixel area is more attenuated than that of other pixels, and the uniformity of the fingerprint identification area in normal display is influenced.

In addition, in the related art, solid holes are formed in the panel part corresponding to the under-screen camera by using laser to increase the transmittance, and researches show that the risk of influencing reliability due to the fact that water and oxygen enter from the hollow edge exists when the solid holes are formed.

In view of this, embodiments of the present disclosure provide a display panel and a display device, which can improve the color shift phenomenon of the bending display area.

Figure 2:
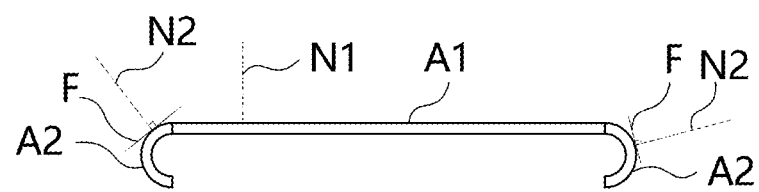

FIG. 1 and FIG. 2 are schematic structural diagrams of a substrate in a front view and a bottom view according to an embodiment of a display panel of the present disclosure.

Referring to FIGS. 1 and 2, in some embodiments, a display panel includes a substrate A and a plurality of pixel units arranged on the substrate A. The substrate A includes a display region. The display region refers to a region where the pixel units are disposed on the surface of the substrate A and used for screen display.

In FIGS. 1 and 2, the display area includes a flat display region A1 and a bending display region A2. The bending display area A2 is adjacent to the flat display area A1. The bending display area A2 can be disposed on at least one side of the flat display area A1. For example, in FIG. 1, two bending display areas A2 are disposed on the left and right sides of the flat display area A1, and are connected to the left and right sides of the flat display area A1.

Referring to FIG. 2, the surface of the planar display area A1 is a plane, and the normal line N1 thereof is a normal line perpendicular to the surface of the planar display area A1. The normal lines N2 of at least a portion of the curved display area A2 are not parallel to a normal line N1 of the planar display area A1. A normal line N2 to any point of the inflection display area A2 refers to a normal line of a tangent plane F passing through the point and perpendicular to the point. For example, the bending display area A2 forms a predetermined angle (the angle is greater than 0°) relative to the flat display area A1, and the bending display area A2 itself may also have a bending shape.

Figure 3:
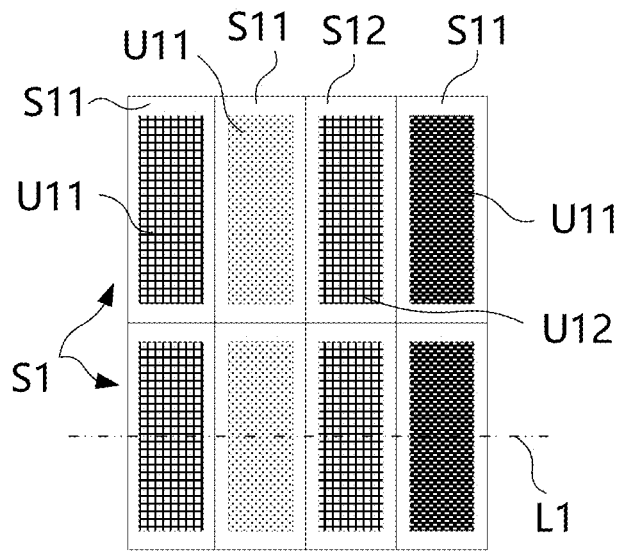
FIGS. 3-5 are schematic diagrams of three arrangements of a plurality of display pixels in a bending display area according to some embodiments of the display panel of the present disclosure.
Figure 4:
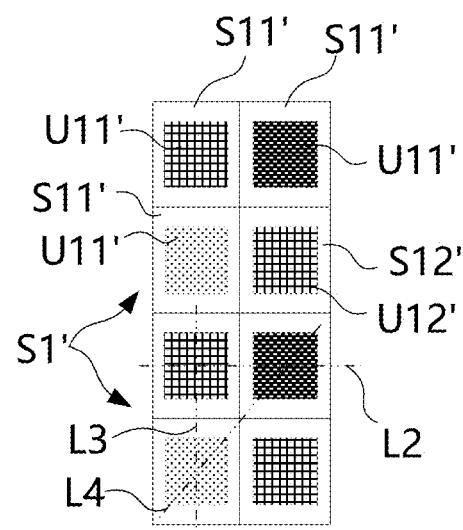
Figure 5:
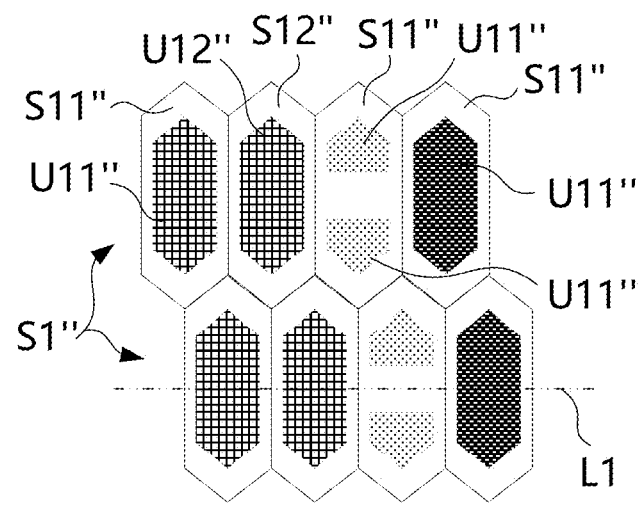

FIGS. 3-5 are schematic diagrams illustrating three arrangement modes of a plurality of display pixels in a bending display area according to some embodiments of the display panel of the present disclosure.

Referring to FIG. 3, in some embodiments, the bending display area A2 includes a plurality of first pixel regions S1 arranged in an array. Two repeated first pixel regions S1 adjacent vertically are schematically shown in FIG. 3. The plurality of pixel units include a plurality of first pixel units respectively located in the plurality of first pixel regions S1. Each of the plurality of first pixel regions S1 includes: a plurality of first pixel sub-regions S11 and at least one second pixel sub-region S12.

Each of the plurality of first pixel units includes: a plurality of first display sub-pixels U11 and at least one color difference adjusting sub-pixel U12 for adjusting color difference of the first pixel unit. Each first pixel sub-region S11 is provided with at least one first displaying sub-pixel U11 of the plurality of first displaying sub-pixels U11, each second pixel sub-region S12 is provided with the at least one color difference adjusting sub-pixel U12, and the at least one second pixel sub-region S12 is disposed adjacent to at least one of the plurality of first pixel sub-regions S11.

In the embodiment, the color difference adjusting sub-pixel is arranged independent of the first display sub-pixel in the pixel unit of the bending display area, and the display effect of the pixel unit is adjusted by adding the color difference adjusting sub-pixel, so that the color deviation phenomenon of the bending display area caused by a larger bending angle is improved.

In some embodiments, the color of at least one color difference adjustment sub-pixel is the same as the color of at least one of the plurality of first display sub-pixels. The color of the color difference adjusting sub-pixel can be selected according to the color deviation condition of the bending display area of the display panel in actual use or experiment. The opening ratio of the sub-pixels with different colors in the bending display area can be changed by selecting the color difference adjusting sub-pixel with the same color as a certain first display sub-pixel so as to improve the color deviation phenomenon. In addition, in the preparation process, the color difference adjusting sub-pixel and the first display sub-pixel with the same color can be formed by evaporation at the same time, and the complexity of the process cannot be increased. In some embodiments, the brightness of at least one color difference adjustment sub-pixel is adjustable. According to the actual color deviation condition, the brightness of the color difference adjusting sub-pixel is correspondingly adjusted, so that the color deviation phenomenon of the bending display area can be improved.

For example, for the phenomenon of turning yellow of the bending display region of the RGB display sub-pixels, the aperture ratio of the blue sub-pixel in the first pixel unit can be increased compared with the other sub-pixels by providing the color difference adjusting sub-pixel with blue color, and the yellowing of the bending display region can be reduced or eliminated by compensating the brightness of the blue sub-pixel. In different embodiments, the bending angles of the bending display area relative to the plane display area are different, and the color deviation degrees are correspondingly different, so that the brightness of the color difference adjusting sub-pixel can be adjusted to meet the requirement of eliminating the color deviation.

The color difference adjusting sub-pixels can have different colors according to the color shift of the bending display area in different display panel embodiments. For example, for a green bending display area, a red color difference adjustment sub-pixel may be used, and for a red bending display area, a green color difference adjustment sub-pixel may be used.

Referring to FIG. 3, in some embodiments, the centers of the plurality of first pixel sub-regions S11 and the centers of the second pixel sub-regions S12 are located on the same line L1. In the first pixel region, the centers of the respective pixel sub-regions are located on the same straight line, and for a plurality of first pixel regions included in the bending display region, adjacent first pixel regions may be arranged along the extending direction of the straight line and/or the vertical direction of the straight line.

In FIG. 3, the first pixel unit includes three first display sub-pixels U11 and one color difference adjustment sub-pixel U12. The first pixel region S1 includes three first pixel sub-regions S11 and one second pixel sub-region S12. The three first display sub-pixels U11 are respectively located in the three first pixel sub-regions S11, and the color difference adjusting sub-pixel U12 is located in the second pixel sub-region S12. In some embodiments, the three first display sub-pixels U11 are a red sub-pixel, a green sub-pixel, and a blue sub-pixel, respectively, and the three first display sub-pixels constitute the three primary colors of RGB. In other embodiments, the three first display sub-pixels U11 may have other colors respectively.

In some embodiments, the color difference adjustment sub-pixel U12 has the same color as one of the red sub-pixel, the green sub-pixel, and the blue sub-pixel. For example, color difference adjusting sub-pixel U12 may have the same color as the blue sub-pixel, and the color difference adjusting sub-pixel U12 may be located between the green sub-pixel and the red sub-pixel. Thus, the pixel structure of the BGB'R is formed, and the phenomenon of color deviation towards yellow of the bending display area can be effectively eliminated. In some embodiments, the color difference adjustment sub-pixel U12 may be disposed adjacent to the first display sub-pixel of the same color, so as to be evaporated through the same aperture of a Fine Metal Mask (FMM), thereby simplifying the manufacturing process.

The shape of the first pixel region, the arrangement (position and color) of the sub-pixels, and the like in the above embodiments can be set as needed. FIGS. 4 and 5 show another two shapes of the first pixel region and the arrangement of the sub-pixels, respectively.

Referring to FIG. 4, in some embodiments, the first pixel region S1' includes three first pixel sub-regions S11' and one second pixel sub-region S12'. The virtual lines connecting the centers of the three first pixel sub-regions S11' form a first shape of a right triangle, and the second pixel sub-region S12' is located on one side of the hypotenuse of the first shape, which is away from a right angle point. In FIG. 4, two repeated first pixel regions S1' adjacent vertically are schematically shown, and it can be seen that straight lines L2, L3 and L4 passing through the centers of three first pixel sub-regions S11' can form a right triangle. In other embodiments, the three straight lines may also form an acute triangle or an obtuse triangle.

With the first pixel region S1' of such a structure, the first pixel unit may include three first display sub-pixels U11' and one color difference adjusting sub-pixel U12'. The three first display sub-pixels U11' are located in the three first pixel sub-regions S11' respectively, and the color difference adjustment sub-pixel U12' is located in the second pixel sub-region S12'.

In some embodiments, the three first display sub-pixels U11' are a red sub-pixel, a green sub-pixel, and a blue sub-pixel, respectively, and the color difference adjusting sub-pixel U12' has the same color as one of the red sub-pixel, the first green sub-pixel, the second green sub-pixel, and the blue sub-pixel. For example, the color difference adjusting sub-pixel U12' and the blue sub-pixel have the same color, the center of the first pixel sub-region S11' where the blue sub-pixel is located may be located at a right angle point of the first shape, the centers of the two first pixel sub-regions S11' where the red sub-pixel and the green sub-pixel are located respectively are located at corner points at two ends of a hypotenuse of the first shape, and the virtual lines connecting the center of the second pixel sub-region S12' and the corner points at two ends of the hypotenuse of the first shape form a second shape of a right triangle.

Referring to FIG. 5, in some embodiments, the centers of the plurality of first pixel sub-regions S11" and the center of the second pixel sub-region S12" are also located on the same line L1. However, unlike the embodiment of FIG. 3, the first pixel unit includes four first display sub-pixels U11" and one color difference adjustment sub-pixel U12".

In FIG. 5, the first pixel region S1" includes three first pixel sub-regions S11" and one second pixel sub-region S12", two of the four first display sub-pixels U11" are located in one of the three first pixel sub-regions S11". The two first display sub-pixels U11" may respectively have the shapes of pentagon in opposite direction. Two other of the first display sub-pixels U11" locate in two other of the three first pixel sub-regions S11", respectively, the color difference adjustment sub-pixels being located in the second pixel sub-region S12".

In addition, the first pixel sub-region S11 and the second pixel sub-region S12 in the embodiment of FIG. 3 are rectangles with the same size, the first pixel sub-region S11' and the second pixel sub-region S12' in the embodiment of FIG. 4 are squares or rectangles with the same size, and the first pixel sub-region S11" and the second pixel sub-region S12" in FIG. 5 are hexagons with the same size. Each of the pixel sub-regions in two first pixel regions S1" adjacent vertically in FIG. 5 are arranged with a shift.

In some embodiments, the four first display sub-pixels U11" are a red sub-pixel, a first green sub-pixel, a second green sub-pixel, and a blue sub-pixel. The first green sub-pixel and the second green sub-pixel are located in the same first pixel sub-region S11", and the color difference adjusting sub-pixel U12" has the same color as one of the red sub-pixel, the green sub-pixel, and the blue sub-pixel. For example, with the color difference adjusting sub-pixel U12' having the same color as the blue sub-pixel, the second pixel sub-region S12" may be located between the first pixel sub-region S11" where the blue sub-pixel is located and the first pixel sub-region S11" where the first green sub-pixel and the second green sub-pixel are collectively located.

Figure 6:
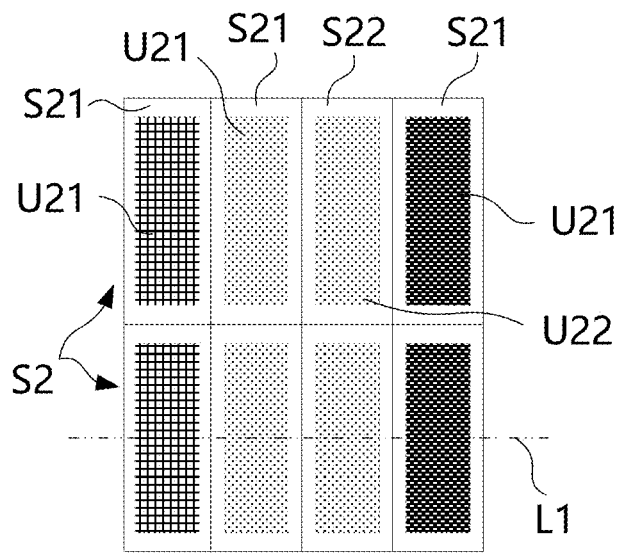
FIGS. 6-8 are schematic diagrams of three arrangements of a plurality of display pixels in a fingerprint identification area according to some embodiments of the display panel of the present disclosure.
Figure 7:
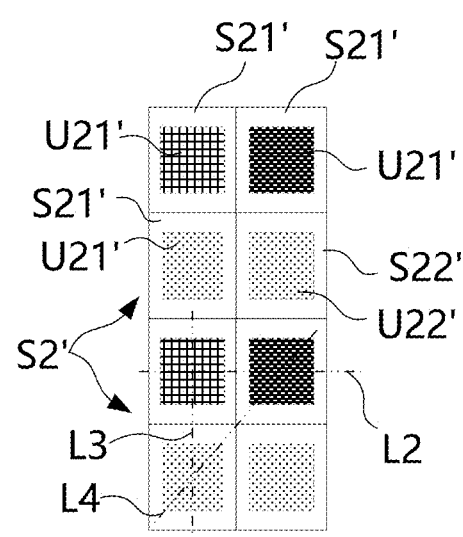
Figure 8:
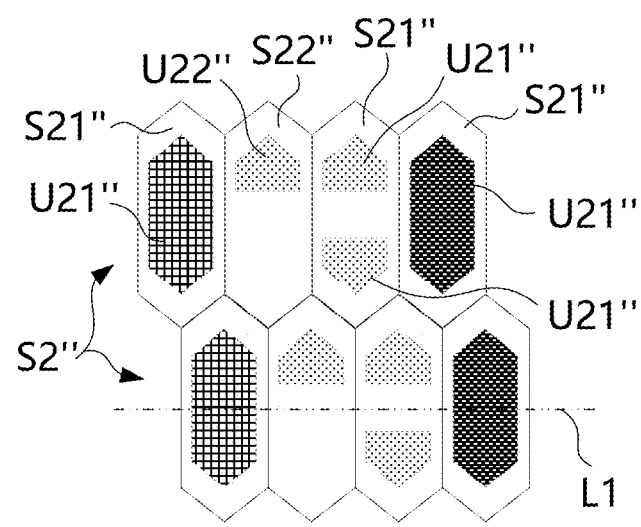

FIGS. 6-8 are schematic diagrams illustrating three ways of disposing a plurality of display pixels in a fingerprint identification area according to some embodiments of the display panel of the present disclosure.

Referring to FIG. 1, in some embodiments, the display area further includes a fingerprint identification area A3, located within the flat display area A1 (shown in FIG. 1 by a rectangular dashed box). The fingerprint recognition area A3 is also provided with pixel units capable of realizing a display function, and the shape and position thereof are not limited to the example shown in FIG. 1. In a display device employing a display panel, a fingerprint recognition sensor (i.e., an in-screen fingerprint recognition sensor) may be provided at a position corresponding to the fingerprint recognition area A3 on the side of the substrate A away from the pixel unit.

Referring to FIG. 6, in some embodiments, the fingerprint identification area A3 includes a plurality of second pixel regions S2 arranged in an array. Two repeated first pixel regions S2 adjacent vertically are schematically shown in FIG. 6. The plurality of pixel units further include a plurality of second pixel units respectively located in the plurality of second pixel regions S2. Each of the plurality of second pixel regions S2 includes: a plurality of third pixel sub-regions S21 and at least one fourth pixel sub-region S22.

Each of the plurality of second pixel units includes: a plurality of second display sub-pixels U21 and at least one fingerprint light source sub-pixel U22 for providing a light source to the fingerprint sensor upon fingerprint recognition. Each third pixel sub-region S21 is provided with at least one second displaying sub-pixel U21 of the plurality of second displaying sub-pixels U21, each fourth pixel sub-region S22 is provided with the at least one fingerprint light source sub-pixel U22, and the at least one fourth pixel sub-region S22 is disposed adjacent to at least one of the plurality of third pixel sub-regions S21.

In this embodiment, the fingerprint light source sub-pixel that are independent of the second display sub-pixel in the pixel element are provided in fingerprint identification area, and when a finger touches the part of the screen that corresponds to the fingerprint identification area, fingerprint light source sub-pixel can emit light in response to the touch of finger, so as to provide light for the finger. In such way, fingerprint sensor senses the fingerprint through the reflected light from the finger. Different from the light of the correlation technique provided by the display pixel during fingerprint identification, this embodiment provides light for the finger through fingerprint light source sub-pixel, saves the service life loss of the display sub-pixel in fingerprint identification area during fingerprint identification, so as to make the display sub-pixel in fingerprint identification area keep substantially same service life as those of other display sub-pixels in display area, thereby improve the homogeneity of fingerprint identification area during normal display.

In some embodiments, the fingerprint light source sub-pixels in the pixel units of the fingerprint identification area can be only transitorily highlighted when being used for fingerprint identification, so that the normal display effect of the fingerprint identification area is not affected.

In some embodiments, the color of at least one fingerprint light source sub-pixel is the same as the color of at least one of the plurality of second display sub-pixels. In some embodiments, the fingerprint light source sub-pixel is disposed adjacent to a second display sub-pixel of the same color, so as to be evaporated using the same aperture of the FMM, thereby simplifying the manufacturing process.

Referring to FIG. 6, in some embodiments, centers of the plurality of third pixel sub-regions S21 and the fourth pixel sub-region S22 are located on the same line L1. In the second pixel region, the centers of the respective pixel sub-regions are located on the same straight line, and for a plurality of second pixel regions included in the fingerprint identification region, adjacent second pixel regions may be arranged along the extending direction of the straight line and/or the perpendicular direction of the straight line.

In FIG. 6, the second pixel unit includes three second display sub-pixels U21 and one fingerprint light source sub-pixel U22. The second pixel region S2 includes three third pixel sub-regions S21 and one fourth pixel sub-region S22. The three second display sub-pixels U21 are respectively located in the three third pixel sub-regions S21, and the fingerprint light source sub-pixel U22 is located in the fourth pixel sub-region S22. In some embodiments, the three second display sub-pixels U21 are a red sub-pixel, a green sub-pixel, and a blue sub-pixel, respectively, and the three second display sub-pixels constitute the three primary colors of RGB. In other embodiments, the three second display sub-pixels U21 may have other colors respectively.

In some embodiments, the fingerprint light source sub-pixel U22 has the same color as the green sub-pixel, and the green sub-pixel has a higher brightness, so as to provide a higher brightness illumination light for the finger. In addition, in the preparation process, the fingerprint light source sub-pixels and the green sub-pixels with the same color can be formed by evaporation at the same time, and the complexity of the process may not be increased. The fourth pixel sub-region S22 is disposed adjacent to the third pixel sub-region S21 in which the green sub-pixel is disposed. Thus, the BGG'R pixel structure is formed, the service life loss of the fingerprint identification area can be eliminated, and the consistency of a display area is improved.

The shape of the second pixel region, the arrangement (position and color) of the sub-pixels, and the like in the above embodiments can be set as needed. FIGS. 7 and 8 show another two shapes of the second pixel region and the arrangement of the sub-pixels, respectively.

Referring to FIG. 7, in some embodiments, the second pixel region S2' includes three third pixel sub-regions S21' and one fourth pixel sub-region S22'. The virtual lines connecting the centers of the three third pixel sub-regions S21' form a third shape of a right triangle, and the fourth pixel sub-region S22' is located on one side of the hypotenuse of the third shape that is away from the right angle point. In FIG. 7, two repeated second pixel regions S2' adjacent vertically are schematically shown, and it can be seen that straight lines L2, L3 and L4 passing through the centers of three third pixel sub-regions S21' can form a right triangle. In other embodiments, the three straight lines may also form an acute triangle or an obtuse triangle.

With the second pixel region S2' of such a structure, the second pixel unit includes three second display sub-pixels U21' and one fingerprint-light-source sub-pixel U22'. The three second display sub-pixels U21' are located in the three third pixel sub-regions S21' respectively and the fingerprint light source sub-pixel U22' is located in the fourth pixel sub-region S22'.

In some embodiments, the three second display sub-pixels U21' are a red sub-pixel, a green sub-pixel, and a blue sub-pixel, respectively, the fingerprint light source sub-pixel U22' has the same color as the green sub-pixel. Further, the center of the third pixel sub-region S21' where the blue sub-pixel is located is positioned at a right angle point of the third shape, the centers of the two third pixel sub-regions S21' where the red sub-pixel and the green sub-pixel are located are positioned at corner points at two ends of a hypotenuse of the third shape, respectively, and the virtual lines connecting the center of the fourth pixel sub-region S22' and the corner points at two ends of the hypotenuse of the third shape form a fourth shape of a right triangle.

Referring to FIG. 8, in some embodiments, the centers of the plurality of third pixel sub-regions S21" and the fourth pixel sub-region S22" are located on the same line L1. However, unlike the embodiment of FIG. 6, the second pixel unit includes four second display sub-pixels U21" and one fingerprint light source sub-pixel U22'.

In FIG. 8, the second pixel region S2" includes three third pixel sub-regions S21" and one fourth pixel sub-region S22", two of the four second display sub-pixels U21" are located in the same one of the three third pixel sub-regions S21". The two second display sub-pixels U21" may respectively have the shapes of pentagon in opposite direction. Two other of the four second display sub-pixels U21" are located within two other of the third pixel sub-regions S21, respectively, the fingerprint light source sub-pixel U22' is located in the fourth pixel sub-region S22".

In addition, the third pixel sub-region S21 and the fourth pixel sub-region S22 in the embodiment of FIG. 6 are rectangles with the same size, the third pixel sub-region S21' and the fourth pixel sub-region S22' in the embodiment of FIG. 7 are squares or rectangles with the same size, and the third pixel sub-region S21" and the fourth pixel sub-region S22" in FIG. 8 are hexagons with the same size. In FIG. 8, each of the pixel sub-regions in two second pixel regions S2" adjacent to each other vertically are arranged with a shift.

In some embodiments, the four second display sub-pixels U21" are a red sub-pixel, a first green sub-pixel, a second green sub-pixel, and a blue sub-pixel. The first green sub-pixel and the second green sub-pixel are located in the same third pixel sub-region S21", and the fingerprint-light-source sub-pixel U22" has the same color as any one of the first green sub-pixel and the second green sub-pixel. The fourth pixel sub-region S22" is disposed adjacent to the third pixel sub-region S21" where the first green sub-pixel and the second green sub-pixel are collectively located. In other embodiments, the fingerprint light source sub-pixel U22" may also be a red sub-pixel or a blue sub-pixel.

Figure 9:
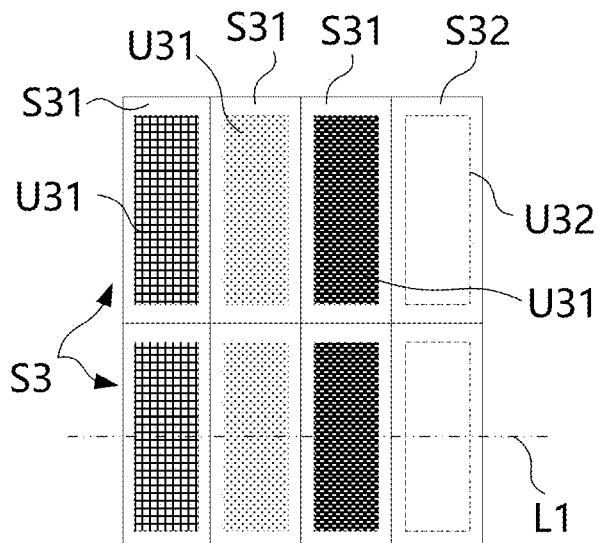
FIGS. 9-11 are schematic diagrams of three arrangements of a plurality of display pixels in a front camera area according to some embodiments of the display panel of the present disclosure.
Figure 10:
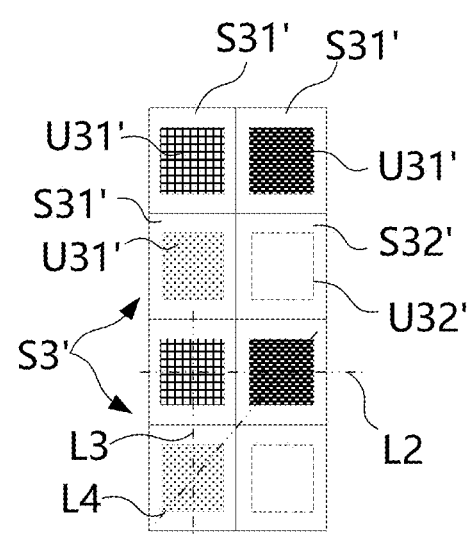
Figure 11:
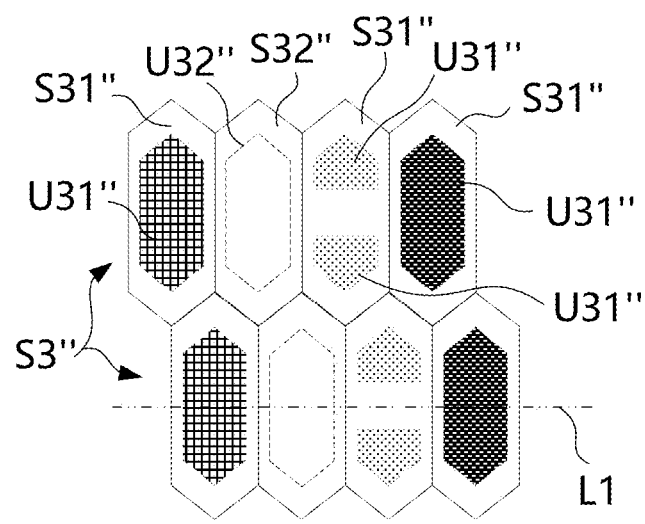
Figure 12:
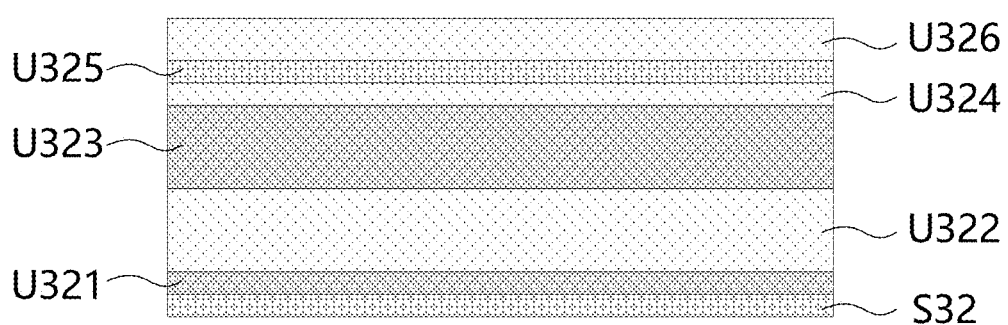
FIG. 12 is a schematic structural diagram of a display panel according to the present disclosure in which transparent display sub-pixels are disposed on a substrate.

FIGS. 9-11 are schematic diagrams of three ways of arranging a plurality of display pixels in a front camera area according to some embodiments of the display panel of the present disclosure. FIG. 12 is a schematic structural diagram of a display panel according to the present disclosure in which transparent display sub-pixels are disposed on a substrate.

Referring to FIG. 1, in some embodiments, the display area further includes a front camera zone A4 located within the flat display zone A1 (shown by a dashed circle in FIG. 1). The front camera area A4 is also provided with pixel units capable of realizing a display function, and the shape and position thereof are not limited to the example shown in FIG. 1. In a display device employing a display panel, a front camera (i.e., an under-screen camera) may be disposed at a position corresponding to the front imaging region A4 on the side of the substrate A away from the pixel unit.

Referring to FIG. 9, in some embodiments, the front imaging region A4 includes a plurality of third pixel regions S3 arranged in an array. Two repeated first pixel regions S1 adjacent vertically are schematically shown in FIG. 9. The plurality of pixel units further include a plurality of third pixel units respectively located in the plurality of third pixel regions S3. Each of the plurality of third pixel regions S3 includes a plurality of fifth pixel sub-regions S31 and at least one sixth pixel sub-region S32.

Each of the plurality of third pixel units includes a plurality of third display sub-pixels U31 and at least one transparent display sub-pixel U32 (shown by dashed boxes). Further, each fifth pixel sub-region S31 is provided with at least one of the plurality of third display sub-pixels U31, each sixth pixel sub-region S32 is provided with the at least one transparent display sub-pixel U32, and the at least one sixth pixel sub-region S32 is disposed adjacent to at least one of the plurality of fifth pixel sub-regions S31.

In this embodiment, the transparent display sub-pixels are arranged in the pixel units of the front camera area, and compared with other normal display areas of the flat display area, the display sub-pixels in the pixel units including the transparent display sub-pixels occupy a smaller area in the pixel units, so that the transmittance of the front camera area can be effectively increased, and the accuracy improvement of the under-screen camera is facilitated.

Referring to FIG. 9, in some embodiments, centers of the plurality of fifth pixel sub-regions S31 and the sixth pixel sub-region S32 are positioned on the same line L1. In the third pixel region, the centers of the respective pixel sub-regions are located on the same straight line, and for a plurality of third pixel regions included in the front camera region, adjacent third pixel regions may be arranged along the extending direction of the straight line and/or the vertical direction of the straight line.

In FIG. 9, the third pixel unit includes three third display sub-pixels U31 and one transparent display sub-pixel U32. The third pixel region S3 includes three fifth pixel sub-regions S31 and one sixth pixel sub-region S32. The three third displaying sub-pixels U31 are respectively located in the three fifth pixel sub-regions S31, and the transparent displaying sub-pixel U32 is located in the sixth pixel sub-region S32. The at least one sixth pixel sub-region S32 may be located on at least one side of the three third display sub-pixels U31.

In some embodiments, the three third display sub-pixels U31 are a red sub-pixel, a green sub-pixel, and a blue sub-pixel, respectively, and the three third display sub-pixels constitute the three primary colors of RGB. In other embodiments, the three third display sub-pixels U31 may have other colors respectively. The shape of the third pixel region, the arrangement (position and color) of the sub-pixels, and the like in the above embodiments can be set as needed. FIGS. 10 and 11 show another two shapes of the third pixel region and the arrangement of the sub-pixels, respectively.

Referring to FIG. 10, in some embodiments, the third pixel region S3' includes three fifth pixel sub-regions S31' and one sixth pixel sub-region S32'. The virtual lines connecting the centers of the three fifth pixel sub-regions S31' form a first shape of a right triangle, and the sixth pixel subregion S32' is located on one side of the hypotenuse of the first shape, which is away from a right-angle point. In FIG. 10, two repeated third pixel regions S3' adjacent vertically are schematically shown, and it can be seen that straight lines L2, L3 and L4 passing through the centers of the three fifth pixel sub-regions S31' can form a right triangle. In other embodiments, the three straight lines may also form an acute triangle or an obtuse triangle.

With the third pixel region S3' of such a structure, the third pixel unit may include three third display sub-pixels U31' and one transparent display sub-pixel U32'. The three third display sub-pixels U31' are located in the three fifth pixel sub-regions S31' respectively, and the transparent display sub-pixel U32' is located in the sixth pixel sub-region S32'.

In some embodiments, the three third display sub-pixels U31' are red, green, and blue sub-pixels, respectively. The centers of the fifth pixel sub-regions S31' where the blue sub-pixels are located are positioned at right-angle points of the first shape, the centers of the two fifth pixel sub-regions S31' where the red sub-pixels and the green sub-pixels are located are positioned at corner points at two ends of the hypotenuse of the first shape, respectively, and the virtual lines connecting the centers of the sixth pixel sub-regions S32' and the corner points at two ends of the hypotenuse of the first shape form a second shape of a right triangle.

Referring to FIG. 11, in some embodiments, the centers of the plurality of fifth pixel sub-regions S31" and the sixth pixel sub-region S32" are also located on the same line L1. However, unlike the embodiment of FIG. 9, the third pixel unit includes four third display sub-pixels U31" and one color difference adjustment sub-pixel U32".

In FIG. 11, the third pixel region S3" includes three fifth pixel sub-regions S31" and one sixth pixel sub-region S32". Further, two of the four third display sub-pixels U31" are located in one of the three fifth pixel sub-regions S31". The two third display sub-pixels U31" may respectively have the shapes of pentagon in opposite direction. Two other of the third display sub-pixels U31" are located within two other of fifth pixel sub-regions S31", respectively, and the transparent display sub-pixel is located in the sixth pixel sub-region S32".

In addition, the fifth pixel sub-region S31 and the sixth pixel sub-region S32 in the embodiment of FIG. 9 are rectangles having the same size, the fifth pixel sub-region S31' and the sixth pixel sub-region S32' in the embodiment of FIG. 10 are squares or rectangles having the same size, and the fifth pixel sub-region S31" and the sixth pixel sub-region S32" in FIG. 11 are hexagons having the same size. Each of the pixel sub-regions in two third pixel regions S3" adjacent to each other vertically in FIG. 11 are arranged with a shift.

In some embodiments, the four third display sub-pixels U31" are a red sub-pixel, a first green sub-pixel, a second green sub-pixel, and a blue sub-pixel. The first green sub-pixel and the second green sub-pixel are located in the same fifth pixel sub-region S31". The sixth pixel sub-region S32" is located between the fifth pixel sub-region S31" in which the blue sub-pixel is located and the fifth pixel sub-region S31" in which the first green sub-pixel and the second green sub-pixel are collectively located.

In the embodiments shown in FIG. 9-11, the transparent display sub-pixel can be implemented in various ways, for example, an opening is provided in the sixth pixel sub-region corresponding to the transparent display sub-pixel. Referring to FIG. 12, in some embodiments, a transparent display sub-pixel may include: a buffer layer U321, a planarization layer U322, an organic light emitting layer U323, a transparent metal layer U324 and a thin film encapsulation layer U326. The buffer layer U321 is located in the sixth pixel sub-region on the substrate surface. The substrate may be, but not limited to, a polyimide film (polyimide film).

The planarization layer U322 is located on a side of the buffer layer U321 away from the substrate A. The organic light-emitting layer U323 is positioned on one side of the planarization layer U322 away from the buffer layer U321. The transparent metal layer U324 is located on a side of the organic light emitting layer U323 away from the planarization layer U322. The thin film encapsulation layer U326 is located on the side of the transparent metal layer 324 away from the organic light-emitting layer U323. The planarization layer, the buffer layer and the substrate can be made of materials with high transparency so as to further improve the light transmittance.

In this embodiment, the transparent metal layer may be formed in the same material and in the same composition process as the metal cathode layer used by the third display sub-pixel in the third pixel unit, for example, Mg:Ag is used. Compared with the third display sub-pixel, the transparent display sub-pixel does not have a metal layer made of the same material as the anode layer between the organic light emitting layer U323 and the planarization layer, so as to reduce the influence on light transmittance.

Referring to FIG. 12, in some embodiments, the transparent display sub-pixel may further include a light coupling layer U325. The optical coupling layer U325 is located between the thin film encapsulation layer U326 and the transparent metal layer U324. The optical coupling layer U325 can increase the light transmittance, further improving the accuracy of the under-screen camera.

Referring to FIG. 1, the portion of the display region other than the bending display region A2, the fingerprint recognition region A3, and the front camera region A4 may be a normal display region, and may adopt any one of the arrangement form of the first pixel region S1 in the bending display region A2, the second pixel region S2 in the fingerprint recognition region A3, and the third pixel region S3 in the front camera region A4, and each pixel sub-region is provided with a display sub-pixel.

The embodiments of the display panel are applicable to a display device, and therefore the present disclosure also provides a display device including any one of the display panels. The display device may be any product or component with a display function, such as a mobile phone, a tablet computer, a television, a display, a notebook computer, a digital photo frame, a navigator and the like.

Thus far, various embodiments of the present disclosure have been described in detail. Some details well known in the art have not been described in order to avoid obscuring the concepts of the present disclosure. Those skilled in the art can now fully appreciate how to implement the teachings disclosed herein, in view of the foregoing description.

Although some specific embodiments of the present disclosure have been described in detail by way of example, it should be understood by those skilled in the art that the above examples are for illustration only and are not intended to limit the scope of the present disclosure. It will be understood by those skilled in the art that various changes may be made and equivalents may be substituted for elements thereof without departing from the scope and spirit of the present disclosure. The scope of the present disclosure is defined by the appended claims.

What is claimed is:

1. A display panel comprising a substrate and a plurality of pixel units arranged on the substrate, wherein:
the substrate comprises a display area, the display area comprises a plane display area and a bending display area, the bending display area is adjacent to the plane display area, and at least part of normal lines of the bending display area is not parallel to a normal line of the plane display area;
the bending display area comprises a plurality of first pixel regions arranged in an array, and the plurality of pixel units comprise a plurality of first pixel units which are respectively positioned in the plurality of first pixel regions; and
each of the plurality of first pixel regions includes a plurality of first pixel sub-regions and at least one second pixel sub-region, each of the plurality of first pixel units includes a plurality of first display sub-pixels and at least one color difference adjusting sub-pixel for adjusting a color difference of the each of the first pixel units, each of the first pixel sub-regions is provided with at least one of the plurality of first display sub-pixels, each of the second pixel sub-regions is provided with the at least one color difference adjusting sub-pixel, and the at least one second pixel sub-region is disposed adjacent to at least one of the plurality of first pixel sub-regions, and
wherein the each of the first pixel units includes four first display sub-pixels and one color difference adjustment sub-pixel, the each of the first pixel regions includes three first pixel sub-regions and one second pixel sub-region, two of the four first display sub-pixels are located in one of the three first pixel sub-regions and two other of the four first display sub-pixels are located in two other of the first pixel sub-regions of the three first pixel sub-regions, respectively, and the one color difference adjustment sub-pixel is located in the one second pixel sub-region.

2. The display panel of claim 1, wherein a color of the at least one color difference adjusting sub-pixel is the same as a color of at least one of the plurality of first display sub-pixels, and a brightness of the at least one color difference adjusting sub-pixel is adjustable.

3. The display panel of claim 1, wherein centers of the plurality of first pixel sub-regions and the second pixel sub-region are located on the same straight line.

4. The display panel of claim 1, wherein the four first display sub-pixels are a red sub-pixel, a first green sub-pixel, a second green sub-pixel, and a blue sub-pixel, the first green sub-pixel and the second green sub-pixel are located in the same first pixel sub-region, and the one color difference adjustment sub-pixel has the same color as one of the red sub-pixel, the first green sub-pixel, the second green sub-pixel, and the blue sub-pixel.

5. The display panel of claim 1, wherein virtual lines connecting centers of the three first pixel sub-regions form a first shape of a right triangle, and the second pixel sub-region is located on a side of a hypotenuse of the first shape away from a right-angled point.

6. The display panel of claim 1, wherein: the display area further comprises a fingerprint identification area positioned in the plane display area, the fingerprint identification area comprises a plurality of second pixel regions arranged in an array, and the pixel units further comprise a plurality of second pixel units respectively positioned in the second pixel regions; and
each of the plurality of second pixel regions includes a plurality of third pixel sub-regions and at least one fourth pixel sub-region, each of the plurality of second pixel units includes a plurality of second display sub-pixels and at least one fingerprint light source sub-pixel for providing a light source to a fingerprint sensor upon fingerprint recognition, each of the third pixel sub-regions is provided with at least one of the plurality of second display sub-pixels, each of the fourth pixel sub-regions is provided with the at least one fingerprint light source sub-pixel, and the at least one fourth pixel sub-region is disposed adjacent to at least one of the plurality of third pixel sub-regions.

7. The display panel of claim 6, wherein a color of the at least one fingerprint light source sub-pixel is the same as a color of at least one of the plurality of second display sub-pixels.

8. The display panel of claim 7, wherein centers of the plurality of third pixel sub-regions and the fourth pixel sub-region are located on the same line.

9. The display panel of claim 8, wherein the each of the second pixel units comprises three second display sub-pixels and one fingerprint light source sub-pixel, the second pixel region comprises three third pixel sub-regions and one fourth pixel sub-region, the three second display sub-pixels are respectively located in the three third pixel sub-regions, and the fingerprint light source sub-pixel is located in the fourth pixel sub-region.

10. The display panel of claim 9, wherein the three second display sub-pixels are a red sub-pixel, a green sub-pixel, and a blue sub-pixel, respectively, and the fingerprint light source sub-pixel has the same color as the green sub-pixel.

11. The display panel of claim 7, wherein the each of the second pixel units comprises four second display sub-pixels and one fingerprint light source sub-pixel, the second pixel region comprises three third pixel sub-regions and one fourth pixel sub-region, two of the four second display sub-pixels are located in the same one of the three third pixel sub-regions, and two other of the four second display sub-pixels are located in two other of the third pixel sub-regions of the three third pixel sub-regions, respectively, and the fingerprint light source sub-pixel is located in the fourth pixel sub-region.

12. The display panel of claim 11, wherein the four second display sub-pixels are a red sub-pixel, a first green sub-pixel, a second green sub-pixel, and a blue sub-pixel, the first green sub-pixel and the second green sub-pixel are located in the same third pixel sub-region, and the fingerprint light source sub-pixel has the same color as any one of the first green sub-pixel and the second green sub-pixel.

13. The display panel of claim 7, wherein the second pixel region includes three third pixel sub-regions and one fourth pixel sub-region, virtual lines connecting centers of the three third pixel sub-regions form a third shape of a right triangle, and the fourth pixel sub-region is located on a side of a hypotenuse of the third shape away from a right angle point.

14. The display panel of claim 13, wherein the each of the second pixel units includes three second display sub-pixels and one fingerprint light source sub-pixel, the three second display sub-pixels are respectively located in the three third pixel sub-regions, the fingerprint light source sub-pixel is located in the fourth pixel sub-region, the three second display sub-pixels are respectively a red sub-pixel, a green sub-pixel and a blue sub-pixel, the fingerprint light source sub-pixel has the same color as the green sub-pixels, and the virtual lines connecting a center of the fourth pixel subregion and corner points at two ends of a hypotenuse of the third shape form a fourth shape of a right triangle.

15. The display panel of claim 1, wherein: the display area further comprises the front camera shooting area positioned in the plane display area, the front camera shooting area comprises a plurality of third pixel regions which are arranged in an array, and the pixel units also comprise a plurality of third pixel units which are respectively positioned in the third pixel regions; and each of the plurality of third pixel regions includes a plurality of fifth pixel sub-regions and at least one sixth pixel sub-region, each of the plurality of third pixel units includes a plurality of third display sub-pixels and at least one transparent display sub-pixel, each of the fifth pixel sub-regions is provided with at least one of the plurality of third display sub-pixels, each of the sixth pixel sub-regions is provided with the at least one transparent display sub-pixel, and the at least one sixth pixel sub-region is disposed adjacent to at least one of the plurality of fifth pixel sub-regions.

16. A display panel comprising a substrate and a plurality of pixel units arranged on the substrate, wherein:

the substrate comprises a display area, the display area comprises a plane display area and a bending display area, the bending display area is adjacent to the plane display area, and at least part of normal lines of the bending display area is not parallel to a normal line of the plane display area;

the bending display area comprises a plurality of first pixel regions arranged in an array, and the plurality of pixel units comprise a plurality of first pixel units which are respectively positioned in the plurality of first pixel regions;

each of the plurality of first pixel regions includes a plurality of first pixel sub-regions and at least one second pixel sub-region, each of the plurality of first pixel units includes a plurality of first display sub-pixels and at least one color difference adjusting sub-pixel for adjusting a color difference of the each of the first pixel units, each of the first pixel sub-regions is provided with at least one of the plurality of first display sub-pixels, each of the second pixel sub-regions is provided with the at least one color difference adjusting sub-pixel, and the at least one second pixel sub-region is disposed adjacent to at least one of the plurality of first pixel sub-regions; and the each of the first pixel regions includes three first pixel sub-regions and one second pixel sub-region, virtual lines connecting centers of the three first pixel sub-regions form a first shape of a right triangle, and the one second pixel sub-region is located on a side of a hypotenuse of the first shape away from a right-angled point, and wherein the each of the first pixel units includes three first display sub-pixels and one color difference adjustment sub-pixel, the three first display sub-pixels are respectively located in the three first pixel sub-regions, the one color difference adjustment sub-pixel is located in the one second pixel sub-region, the three first display sub-pixels are respectively a red sub-pixel, a green sub-pixel, and a blue sub-pixel, the one color difference adjustment sub-pixel has the same color as one of the red sub-pixel, the green sub-pixel, and the blue sub-pixel, and virtual lines connecting centers of the one second pixel sub-region and corner points at both ends of the hypotenuse of the first shape form a second shape of a right triangle.

17. A display device comprises a display panel, wherein: the display panel comprises a substrate and a plurality of pixel units arranged on the substrate, the substrate comprises a display area, the display area comprises a plane display area and a bending display area, the bending display area is adjacent to the plane display area, and at least part of normal lines of the bending display area is not parallel to a normal line of the plane display area;

the bending display area comprises a plurality of first pixel regions arranged in an array, and the plurality of pixel units comprise a plurality of first pixel units which are respectively positioned in the plurality of first pixel regions; and each of the plurality of first pixel regions includes a plurality of first pixel sub-regions and at least one second pixel sub-region, each of the plurality of first pixel units includes a plurality of first display sub-pixels and at least one color difference adjusting sub-pixel for adjusting a color difference of the each of the first pixel units, each of the first pixel sub-regions is provided with at least one of the plurality of first display sub-pixels, each of the second pixel sub-regions is provided with the at least one color difference adjusting sub-pixel, and the at least one second pixel sub-region is disposed adjacent to at least one of the plurality of first pixel sub-regions, and wherein the each of the first pixel units includes four first display sub-pixels and one color difference adjustment sub-pixel, the each of the first pixel regions includes three first pixel sub-regions and one second pixel sub-region, two of the four first display sub-pixels are located in one of the three first pixel sub-regions and two other of the four first display sub-pixels are located in two other of the first pixel sub-regions of the three first pixel sub-regions, respectively, and the one color difference adjustment sub-pixel is located in the one second pixel sub-region.

* * * * *